(12) United States Patent
DeRose (10) Patent No.: US 7,695,166 B2
(45) Date of Patent: Apr. 13, 2010

(54) SHAPED LED LIGHT BULB

(76) Inventor: Anthony DeRose, 7 Damascus Drive, Caledon East, ON (CA) L0N 1E0

(*) Notice: Subject to any disclaimer, the term of this patent is extended or adjusted under 35 U.S.C. 154(b) by 243 days.

(21) Appl. No.: 11/931,891

(22) Filed: Oct. 31, 2007

(65) Prior Publication Data

US 2008/0084692 A1   Apr. 10, 2008

Related U.S. Application Data

(60) Continuation-in-part of application No. 11/118,480, filed on May 2, 2005, now abandoned, which is a division of application No. 09/990,326, filed on Nov. 23, 2001.

(51) Int. Cl.
*F21V 3/02* (2006.01)
*F21V 5/04* (2006.01)

(52) U.S. Cl. ............... 362/311.15; 362/311.02; 362/230; 362/244

(58) Field of Classification Search ........... 362/231, 362/230, 800, 311.02, 311.15, 244, 257, 362/246, 249.02, 211, 215, 235; 313/498, 313/512; 257/79, 98, 100, 103
See application file for complete search history.

(56) References Cited

U.S. PATENT DOCUMENTS

| | | | | |
|---|---|---|---|---|
| 3,780,357 A * | 12/1973 | Haitz | ................... | 257/100 |
| 3,821,590 A * | 6/1974 | Kosman et al. | ............. | 313/499 |
| 5,564,819 A * | 10/1996 | Yamaguchi | ................. | 362/241 |
| 5,865,529 A * | 2/1999 | Yan | ............... | 362/327 |
| 2003/0079387 A1* | 5/2003 | Derose | ................... | 40/544 |
| 2003/0168670 A1* | 9/2003 | Roberts et al. | ................ | 257/98 |

* cited by examiner

*Primary Examiner*—Bao Q Truong
(74) *Attorney, Agent, or Firm*—InterContinental IP; Eric Hanscom; Todd Langford (57) ABSTRACT

An LED light bulb where the LED light bulb itself is molded into various shapes. The plastic lens used to surround the diode is shaped when manufactured to resemble various items, such as stars, crosses, hearts, trees, pinecones, bulbs, flat panels with designs, or any other shape the user desires. Because the entire light bulb is the LED, uniform and consistent light can be emitted from every part of the plastic lens that makes up the shaped LED light bulb, allowing the user to view the shaped LED light bulb from any angle. The shaped LED light bulb can be used individually, or strung together to form a strand of shaped lights.

21 Claims, 6 Drawing Sheets

SHAPED LED LIGHT BULB

CROSS REFERENCE TO RELATED APPLICATIONS

This application is a continuation in part and claims the benefit of U.S. patent application Ser. No. 11/118,480, to DeRose, filed on May 2, 2005 which in turn is a divisional application of U.S. patent application Ser. No. 09/990,326, filed on Nov. 23, 2001, the entireties of which are hereby incorporated by reference.

STATEMENT REGARDING FEDERALLY SPONSORED RESEARCH OR DEVELOPMENT

This invention was not federally sponsored.

BACKGROUND OF THE INVENTION

Field of the Invention

This invention relates to the general field of LED lights, and more specifically toward an LED light bulb where the LED light bulb itself is molded into various shapes. The plastic lens used to surround the diode is shaped when manufactured to resemble various items, such as stars, crosses, hearts, trees, pinecones, bulbs, flat panels with designs, or any other shape the user desires. Because the entire light bulb is the LED, uniform and consistent light can be emitted from every part of the plastic lens that makes up the shaped LED light bulb, allowing the user to view the shaped LED light bulb from any angle. The shaped LED light bulb can be used individually, or strung together to form a strand of shaped lights.

LED light bulbs are preferable over florescent or incandescent light bulbs. They require less power to produce the same amount of light as florescent or incandescent light bulbs. Further, LED light bulbs have extremely long life spans, and do not contain mercury. LEDs are prime candidates for many applications requiring sources of light.

An LED, or light emitting diode, is a light-producing object that produces light by passing electricity through a p-n junction biased in the forward direction. A plastic lens surrounds the diode to protect it. The light leaves the diode and travels through the plastic lens where it exits the LED light bulb. Prior art LED bulbs are generally small and cylindrical, usually measuring at most about 5 mm in diameter. The light produced by LEDs can be of various colors and intensity. The light, however, tends to be a point source of light. Light exits through the plastic lens in one direction and at a narrow angle as compared to florescent or incandescent light bulbs. Further, LED light bulbs with simple plastic lenses are not pleasing to look at. They can be strung together to form strands of lights, but they remain point sources of light.

Manufacturing LED light bulbs can be a difficult process. The prior art teaches the use of cap type molds. A liquid resin is injected into the molds and heated to about 130° C. Because of the molds used, only cap type shapes have been created; three-dimensional shapes would be impossible to create using this method.

To overcome some of these issues, the prior art has taught LED light bulbs that are inserted into other materials. These covers take the light emitted from the LED light bulb and disperse it. These covers can be made of many different transparent or translucent materials, such as glass or plastic, and can be of various shapes, sizes, and colors. The original light source, however, is still an LED light bulb, which has a small point source of light. This creates a light-producing object that emits an inconsistent amount of light over the surface of the object. Further, the LED can become dislodged from the cover, or the cover can break.

U.S. Pat. No. 5,743,616, to Giuliano et al., discloses an LED illuminated image display. It uses LED lights imbedded in the edge of a flat panel to light up the panel. However, in this patent, the LED light bulb is separate from the panel. A standard LED light bulb is inserted into the edge of the flat panel, and the panel merely redirects light emitted by the LED light bulb. Giuliano does not teach of a display where the LED light bulb and the display are in fact one and the same. Further, the etched panels disclosed in Giuliano cannot be viewed from all angles.

U.S. Pat. No. 4,965,701, to Voland, discloses an illuminated curtain, where the curtain has strands of lights. These strands have light bulbs that produce light, and these light bulbs are placed inside of other members, where these members can be different shapes, sizes, and colors. The light bulb, and the surrounding member are, however, two distinct objects. The surrounding member can be broken separately from the light, or the light can become separated from the surrounding member, leaving a simple point source of light. Voland does not teach a strand of lights where the light bulbs themselves are various shapes, sizes and colors and do not require a surround member to achieve such a purpose.

U.S. Pat. No. 5,217,286, to Ming-ho, discloses a variety of ornaments and structures. Ming-ho, however, does not disclose an LED light bulb where the LED light bulb itself is the ornament or structure. U.S. Pat. No. 5,151,679, to Dimmick, discloses the use of light scattering elements such as metal shavings or bubbles. However, Dimmick does not teach the use of scattering elements such as metal shavings or bubbles in the plastic lens of the LED light bulb itself.

Thus there has existed a long-felt need for a an object that produces light that can be a particular shape, size and color, where the entire object can emit a uniform and consistent amount of light as well as be viewed from any angle. The light source should be efficient to operate as well as be durable and have an extremely long useful lifespan.

The current invention provides just such a solution by having an LED light bulb where the LED light bulb itself is molded into various shapes. The plastic lens used to surround the diode is shaped when manufactured to resemble various items, such as stars, crosses, hearts, trees, pinecones, bulbs, flat panels with designs, or any other shape the user desires. Because the entire light bulb is the LED, uniform and consistent light can be emitted from every part of the plastic lens that makes up the shaped LED light bulb, allowing the user to view the shaped LED light bulb from any angle. The shaped LED light bulbs can be used individually, or strung together to form a strand of shaped lights.

There has thus been outlined, rather broadly, the more important features of the invention in order that the detailed description thereof may be better understood, and in order that the present contribution to the art may be better appreciated. There are additional features of the invention that will be described hereinafter and which will form the subject matter of the claims appended hereto. The features listed herein and other features, aspects and advantages of the present invention will become better understood with reference to the following description and appended claims. The accompanying drawings, which are incorporated in and constitute part of this specification, illustrate embodiments of the invention and, together with the description, serve to explain the principles of the invention.

SUMMARY OF THE INVENTION

This invention is simply an LED light bulb, where the LED light bulb itself can be of different shapes, colors, and sizes. These LED light bulbs can be used individually, or strung together to form a strand of shaped lights. The key difference over the prior art is that this invention can have a larger plastic lens where the lens is shaped to anything the user desires.

To make the LED light bulb, a mold must first be created. The mold determines the shape and size of the LED light bulb, as well as any surface effects that the LED light bulb may have. Stars, crosses, hearts, trees, pinecones, bulbs, flat panels with designs, or any other shape the user desires can be manufactured. Preferably, a cavity mold with two halves should be created with the desired three-dimensional design of the LED light bulb. The cavity mold is created by means of an injection mold. Grooves, ridges, etching, or other surface effects are built directly into the walls of the injection mold to create the opposite effect in the cavity mold. The cavity mold itself should be made from a plastic material that epoxy resin or silicon will not stick to, such as polyethylene terephthalate (PET), nylon, polymethylpentene (TPX®), and polycarbonate (PC). Further, the cavity mold itself must be able to withstand temperatures of at least 130° C. without distorting the shape of the mold. The plastic material of the cavity mold should also be durable so that the cavity mold can be used repeatedly without the need of repair. Finally, the top of the cavity mold should have an opening that is slightly tapered. The opening allows the epoxy resin to be poured into the mold. The tapered opening allows for a wire connector to easily slide onto the LED light bulb.

It is important to understand that the process for making the LED light bulbs themselves does not require the use of injection molds. After an injection mold has been used over 1,000,000 times, it must be replaced. A cavity mold must be replaced after approximately the same number of uses. However, since over 1,000 LED light bulbs can be made with each cavity mold, as opposed to the single LED light bulb per injection mold, the cavity mold can create 1,000 times as many LED light bulbs per mold compared to the injection mold. Further, the cavity molds are less expensive to create than injection molds, and can be reused to create new cast molds. The injection mold is used to create the cavity mold, which in turn can be used to create millions of LED light bulbs.

The two halves of the cavity mold are aligned together by the use of guide rods. These rods ensure that each half of the cavity mold aligns properly with the other half. Each half of the cavity mold must fit securely together to form a sealed cast mold so that the epoxy resin will not leak out. Clamps can be used to secure the two halves of the cavity mold together. The halves of the cavity mold can also be secured together by enclosing the cavity mold within another structure. This structure surrounds the outside of the cavity mold leaving an opening in the top so that the cavity molds can be inserted and removed from the structure, as well as allowing the raw LEDs and resin to be inserted into the cavity mold.

Multiple cavity molds can also be used at the same time. They can be aligned with each other using the same guide rods used to align each half. The cavity molds can be secured together by various means, including by using clamps or enclosing the cavity molds in a structure. This structure is similar to the one described above, but is designed to accommodate multiple cavity molds at the same time.

The raw LED comprises a diode that must be surrounded by a protective cover, such as a plastic lens. The raw light emitting diode is coated with an epoxy resin to protect it when it is inserted into the mold. The raw LEDs are connected to upper and lower guide wires to aid in orienting and holding the raw LEDs in the mold. Before being placed in the mold, however, each diode, individually or in groups, should be tested to make sure the diodes are working properly.

The resin chosen for the plastic lens determines the color and clarity of the lens, but not necessarily the color of the light that is emitted from the LED light bulb. For example, a clear plastic lens could be created whereby red light is emitted from the diode. The material used for the plastic lens can be an epoxy resin, polymethylmethacrylate, acrylic, engineered thermoplastic polycarbonate, silicon, or other like materials. The plastic lens can be transparent or translucent. Further, other additives, such as metal particles and bubbles, can be added to the resin before it is poured to create different lighting effects.

Once the cavity mold is created, the cavity mold is secured in place and heated to a temperature of at least 120° C., but preferable 130° C., for one hour. The cavity mold is then filled with the epoxy resin and the raw LEDs are inserted through the opening at the top of the cavity mold. The cavity mold is then once again heated to at least 120° C., but preferably 130° C., for one to one and a half hours. At this time, the epoxy resin becomes solid and is formed into the desired shape. An alternative method for curing the epoxy resin is to use ultraviolet lighting. Instead using heating the epoxy resin, the epoxy resin is cured by irradiating it with ultraviolet light, generally for a period of seconds.

After the resin has cured, the cavity molds are separated and the three dimensionally shaped LED light bulb is removed. If the molds are secured together by use of clamps, the clamps need not be removed, but rather only loosened to allow the two halves of the cavity mold to separate. If the cavity molds are secured together by being placed in a structure, they also need not be removed from the structure to remove the shaped LED light bulb. Rather, the cavity molds can be separated while remaining in the structure. By leaving the molds in the clamps or in the structure, valuable manufacturing time can be saved. Also, the cavity mold need not be cooled down before the LED light bulb is removed. This also removes the requirement of preheating the cavity mold, as the cavity mold is already at the desired temperature for creating the LED light bulb. Therefore, the cavity mold can be used continuously without cooling and reheating the mold. Once the shaped LED light bulb has been created, no cleaning or polishing is required.

For more complex designs, the cavity mold cavity can be filled with shapes or designs made from steel, glass, plastic, or other suitable materials before the resin is poured. A reflective surface can be placed on one side of the mold so that light is emitted from only part of the entire bulb. Integrated circuits, switches, batteries, or other electronic components can also be placed in the mold cavity along with the raw LED, allowing for a wide range of lighting options. For example, a full wave rectifier or a current controller can be located inside of the plastic lens. A battery, including a rechargeable battery, could be located inside of the plastic lens to create a stand alone self-powered LED light bulb. Alternatively, the wires from the LED could be connected directly or indirectly to a solar panel.

Multiple raw LEDs can also be used in one bulb, and when these are combined with other electronic components, a bright shaped LED light bulb or one that changes colors can be created. A shaped LED light bulb with multiple raw LEDs and an integrated circuit can create a color changing light bulb without the costly use of multiple bulbs or color changing controllers. Another design possibility is to partially fill the cavity mold with different colored epoxy resin or silicon at different times. For example, part of the cavity mold could be filled with a red epoxy resin and allowed to cure. Then another portion of the cavity mold could be filled with a white epoxy resin and allowed to cure. Finally, the rest of the cavity mold could be filled with a blue epoxy resin and allowed to cure. This would create a red, white, and blue colored LED light bulb. Alternatively, a shaped LED light bulb can located inside of an additional plastic lens, which itself can be shaped, include light scattering elements on the surface, or include light scattering elements internally. These processes can be used to create multicolored, layered, shaped LED light bulbs.

A string of shaped LED light bulbs can also be easily created from this process. The wires connecting the shaped LED light bulbs can be secured to the raw LEDs before the molding process. These wires can even be encapsulated inside the shaped LED light bulb making the shaped LED light bulb waterproof and more resistant to high temperatures. These shaped LED light bulbs can be wired in series or run in parallel. A group of shaped LED light bulbs can be run in parallel, and then this group can be run in series, allowing a greater number of shaped LED light bulbs to be strung together without increasing the voltage requirements. It is possible to run 2,000 or more shaped LED light bulbs together using a single 110-volt power source.

It is also contemplated that the LED light bulb itself can be a sign where the sign itself should have a design and emit light. Examples of this would be an emergency exit sign, an open/closed sign for a business, an advertising sign, or even a car nameplate. The body of the LED light bulb can contain holes or other means to mount the LED Light bulb directly to a wall or other apparatus.

It is further contemplated by the inventor that the LEDs could be used to create a flat LED display panel. Because of the ability of diodes to sense light instead of emit light, it is also possible to use the shaped LED light bulbs to sense light. If the LED light bulbs are used to create a flat LED panel, this panel could be a sensor panel instead of a display panel.

This invention has many benefits over the prior art. One benefit is that there is no restriction as to the size of the LED light bulb—it can be as thin as two mm or as thick as 100 mm or more. There is no need to drill a hole and insert an LED into the bulb. Further, there is no need for potting liquid to bond the LED in place. Since the shape of the bulb is completely finished by the time it is removed from the mold, there is no need to etch the design after molding, nor is there a need to clean or polish the bulb after molding. Additionally, the process for creating the current shaped LED light bulb requires the same amount of energy as the prior art process to create a small 3 mm LED, while at the same time producing less chemical pollution to create the plastic lens than the prior art processes.

It is a principal object of the invention to provide an object capable of producing light that can be of various shapes, sizes, and colors.

It is another object of the invention to provide an object capable of producing light where the light that is produced can be uniform and consistent over the entire surface of the bulb.

It is an additional object of the invention to provide an object capable of producing light that its sculptured look and shape can be viewed from all angles.

It is a further object of the invention to provide an object capable of producing light where there is no need to drill the object and then place an LED inside of the object.

It is a final object of this invention to provide an object capable of producing light that is durable, efficient, long lasting, and pleasing to look at.

It should be understood the while the preferred embodiments of the invention are described in some detail herein, the present disclosure is made by way of example only and that variations and changes thereto are possible without departing from the subject matter coming within the scope of the following claims, and a reasonable equivalency thereof, which claims I regard as my invention.

DETAILED DESCRIPTION OF THE FIGURES

Figure 1:
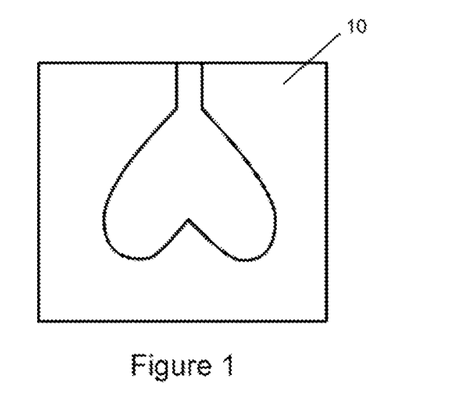
FIG. 1 is a front cutaway view of a mold.

FIG. 1 is a front cutaway view of a cavity mold. The cavity mold 10 defines the shape of an LED light bulb (not shown in this figure).

Figure 2:
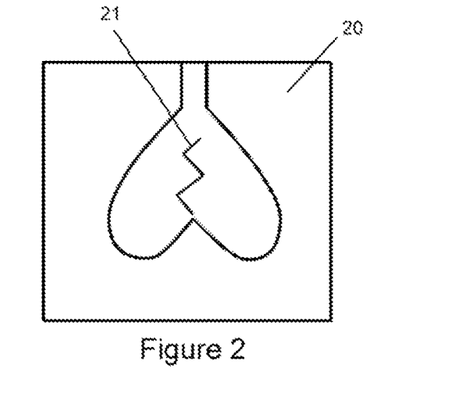
FIG. 2 is a front cutaway view of a mold with a ridge.

FIG. 2 is a front cutaway view of a cavity mold with a ridge. The cavity mold 20 defines the shape of an LED light bulb (not shown in this figure). Further, there is a ridge 21 that will create a groove in the LED light bulb when it is molded.

Figure 3:
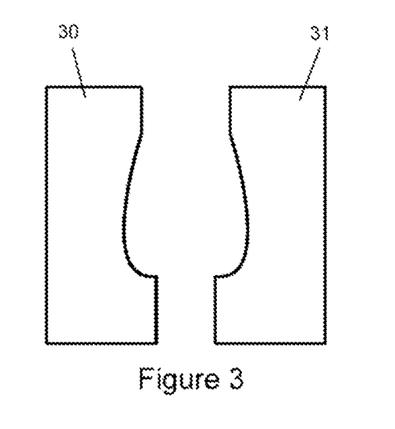
FIG. 3 is a side cutaway view of two separate halves of a mold.

FIG. 3 is a side cutaway view of two separate halves of a cavity mold. The left half of the cavity mold 30 fits and mates with the right half of the cavity mold 31. Each cavity mold may be, but is not necessarily, the mirror image of the other half.

Figure 4:
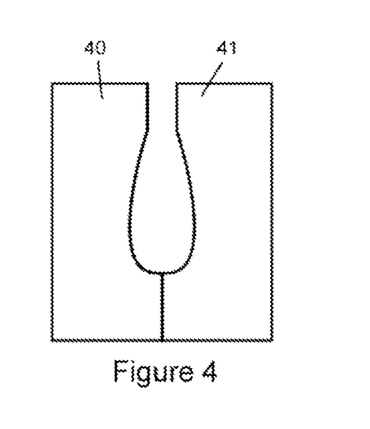
FIG. 4 is a side cutaway view of two halves of a mold that are placed together.

FIG. 4 is a side cutaway view of two halves of a cavity mold that are placed together. The left half of the cavity mold 40 fits and mates with the right half of the cavity mold 41.

Figure 5:
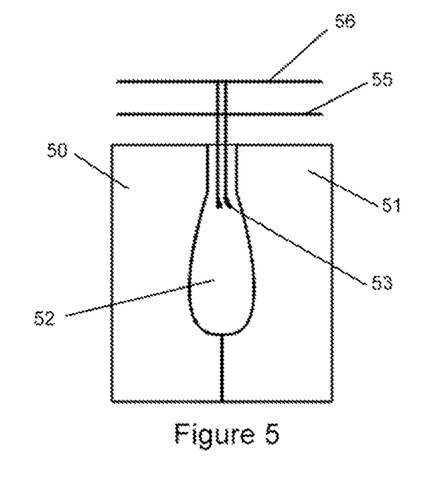
FIG. 5 is a side view of two halves of a mold with a shaped LED light bulb in the mold.

FIG. 5 is a side view of two halves of a cavity mold with a shaped LED light bulb in the cavity mold. The left half of the cavity mold 50 fits and mates with the right half of the cavity mold 51. The raw diode 53 is placed in between the left half of the cavity mold 50 and the right half of the cavity mold 51. The raw diode 53 is connected to a lower guide wire 55 and an upper guide wire 56. The resin for the plastic lens is poured into the cavity 52 left between the two halves of the cavity mold.

Figure 6:
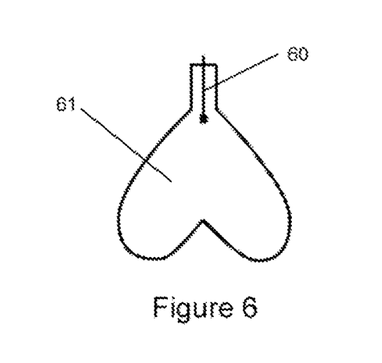
FIG. 6 is a front view of a shaped LED light bulb.

FIG. 6 is a front view of a shaped LED light bulb. The raw diode 60 is surrounded by the plastic lens 61 that has been shaped by the mold (not shown in this figure).

Figure 7:
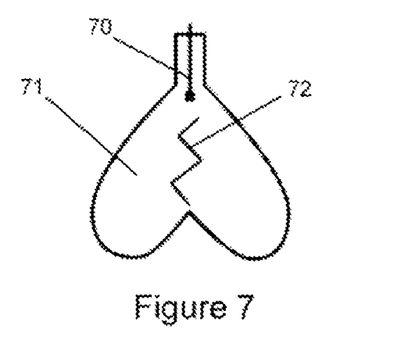
FIG. 7 is a front view of a shaped LED light bulb with a groove.

FIG. 7 is a front view of an LED light bulb with a groove. The raw diode 70 is surround by the plastic lens 71 that has been shaped by the mold (not shown in this figure). There is also a groove 72 in the plastic lens created by a ridge in the mold.

Figure 8:
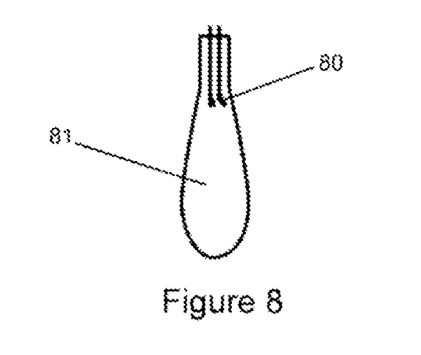
FIG. 8 is a side view of a shaped LED light bulb.

FIG. 8 is a side view of a shaped LED light bulb. The raw diode 80 is surrounded by the plastic lens 81 that has been shaped by the mold (not shown in this figure).

Figure 9:
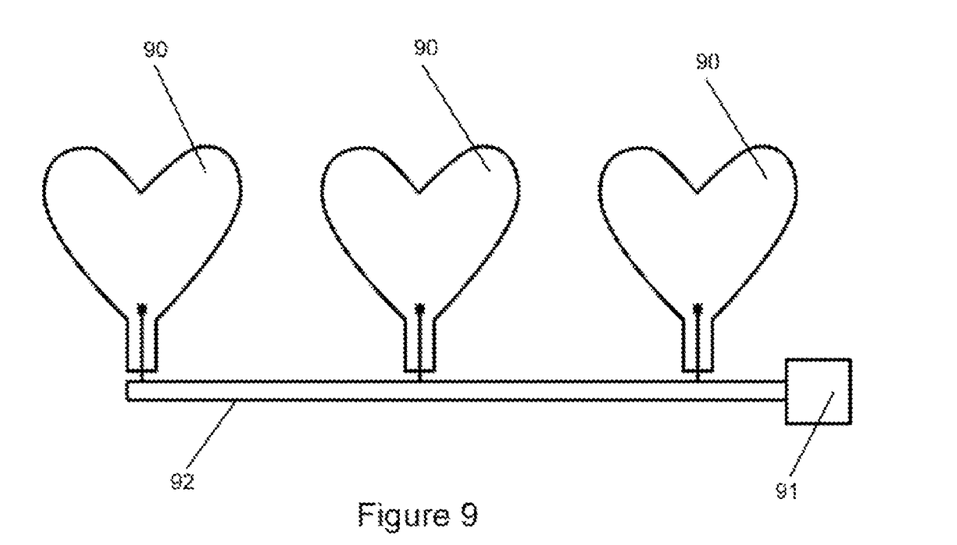
FIG. 9 is a side view of a strand of shaped LED light bulbs.

FIG. 9 is a side view of a strand of shaped LED light bulbs. The LED light bulbs 90 are connected to a power source 91 by means of wires 92.

Figure 10:
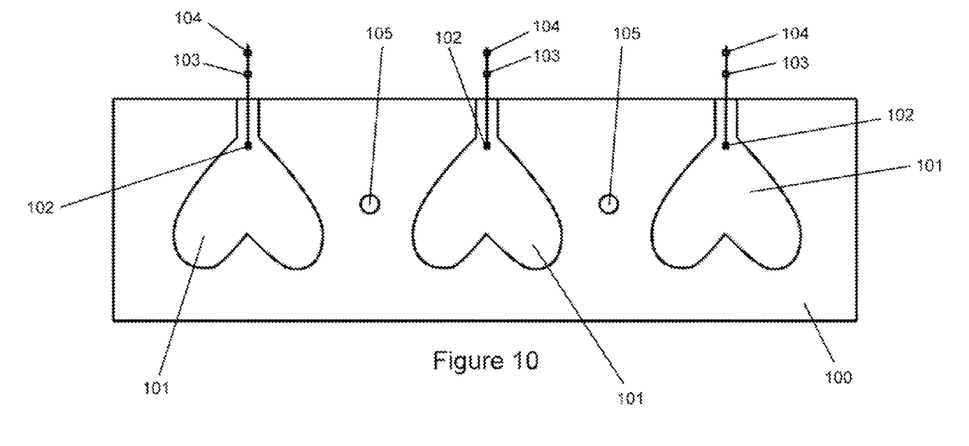
FIG. 10 is a side cutaway view of a mold with 3 shaped LED light bulbs in the mold.

FIG. 10 is a side cutaway view of a cavity mold to create three shaped LED light bulbs. The cavity mold 100 has three cavities 101 that are used to create the shape of the plastic lens (not shown in this figure). A raw diode 102 is placed into the cavity 101 such that when the resin of the plastic lens is poured into the cavity mold 100, the plastic lens will completely surround the raw diode 102. The raw diode 102 is connected to a lower guide wire 103 and an upper guide wire 104 which hold the raw diode 102 in the empty cavity 101. The cavity mold 100 also has guide rods 105 which align the cavity molds when they are placed together.

Figure 11:
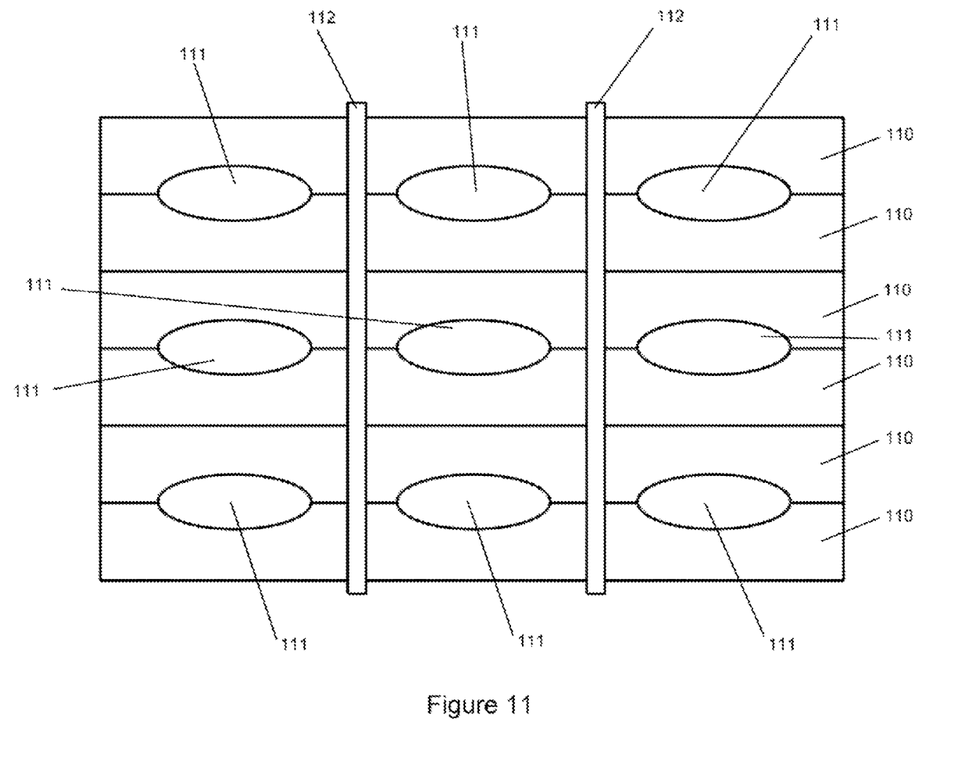
FIG. 11 is a top cutaway view of multiple molds put together.

FIG. 11 is a top cutaway view of multiple cavity molds put together. Each mold 110 is mated with its other half, and placed together to form cavities 111. The cavity molds are aligned and kept in a proper position by the use of guide rods 112, which run through each cavity mold 110.

Figure 12:
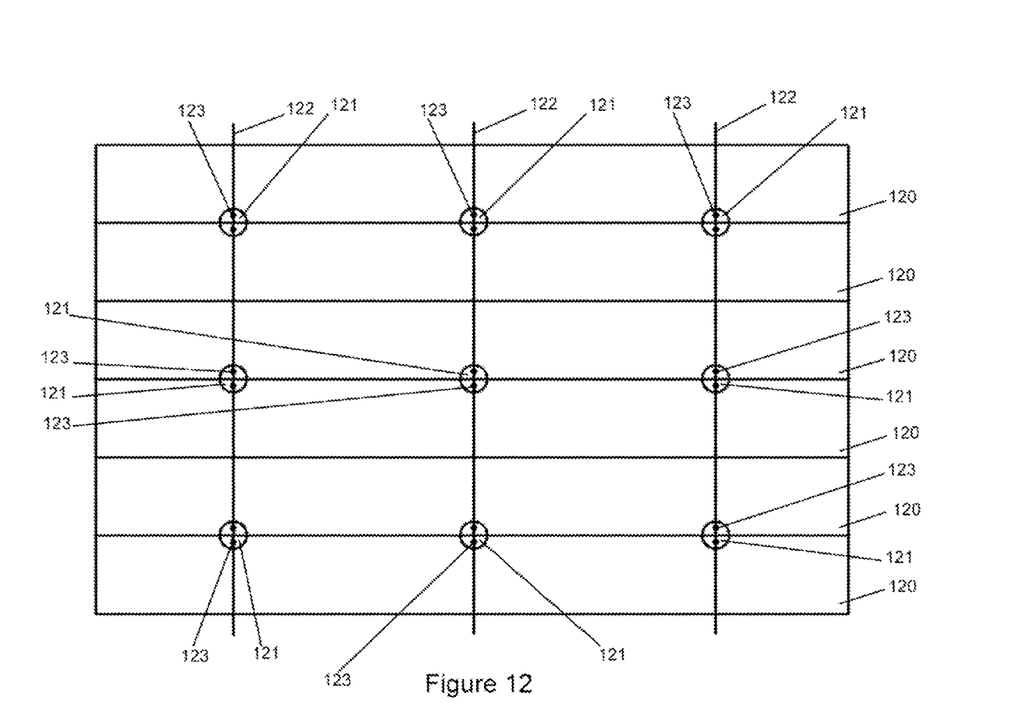
FIG. 12 is a top view of multiple molds put together.

FIG. 12 is a top view of multiple cavity molds put together. Each cavity mold 120 is mated with its other half, and placed together to form cavities 121, and these cavities extend to the top of the cavity mold 120. Upper and lower guide wires 122 hold the raw diodes 123 in place in the cavities 121 created by the cavity molds 120.

Figure 13:
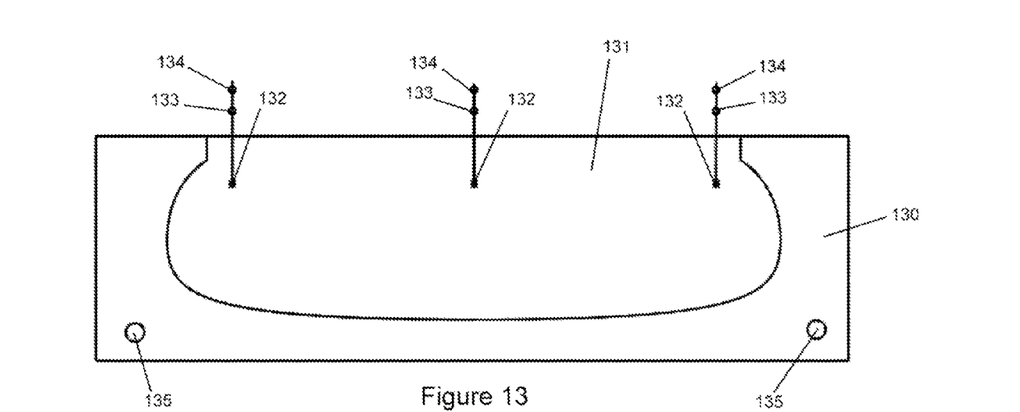
FIG. 13 is a side cutaway view of a cavity mold to create a shaped LED light bulb with three raw diodes.

FIG. 13 is a side cutaway view of a cavity mold to create a shaped LED light bulb with three raw diodes. The cavity mold 130 has one cavity 131 that is used to create the shape of the plastic lens (not shown in this figure). Three raw diodes 132 are placed into the cavity 131. The raw diodes 132 are connected to a lower guide wires 133 and an upper guide wires 134 which hold the raw diodes 132 in the cavity 131. The cavity mold 130 also has guide rods 135 which align the cavity molds when they are placed together.

Figure 14:
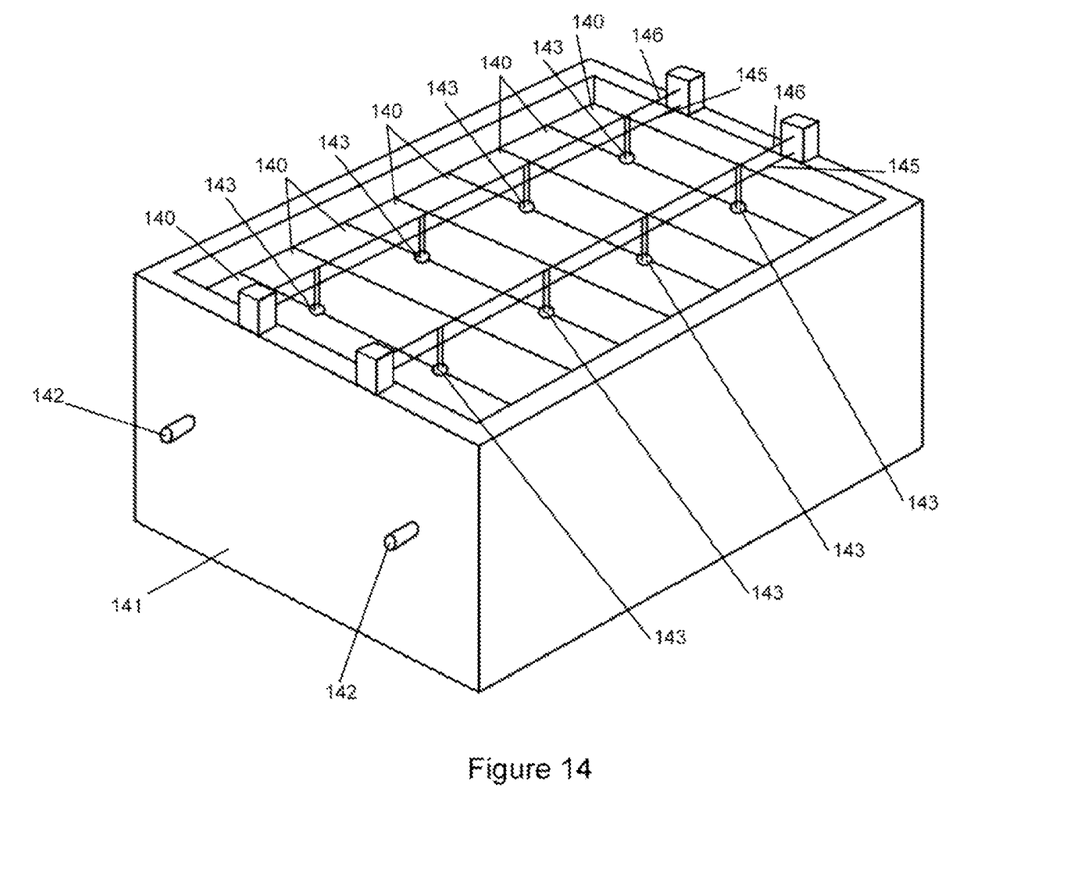
FIG. 14 is a perspective view of multiple cavity molds in a structure that secures the cavity molds together.

FIG. 14 is a perspective view of multiple cavity molds in a structure that secures the cavity molds together. Cavity molds 140 are contained within the structure 141. Guide rods 142 that run through the cavity molds 140 also run through the structure 141, thereby aligning the cavity molds 140 together in the structure 141. Raw diodes 143 are suspending in the cavities 144 in the cavity molds 140. The raw diodes 143 are connected to lower guide wires 145 and upper guide wires 146, which suspend the raw diodes 143 in the cavities 144. The lower guide wires 145 and the upper guide wires 146 are secured to the structure 141 to hold and secure all the various components in place.

Figure 15:
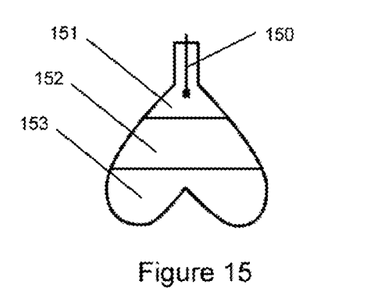
FIG. 15 is a front view of a shaped LED light bulb with layers of epoxy resin.

FIG. 15 is a front view of a shaped LED light bulb with layers of epoxy resin. A first layer 151, second layer 152, and third layer 153 of epoxy resin are used to encapsulate a raw diode 150.

Figure 16:
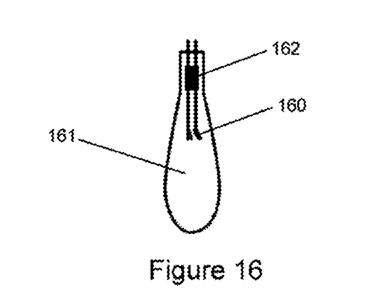
FIG. 16 is a side view of a shaped LED light bulb with a battery.

FIG. 16 is a side view of a shaped LED light bulb with a battery. The raw led 160 of the bulb 161 is connected to a batter 162, where the batter is also encapsulated by the bulb 161.

Figure 17:
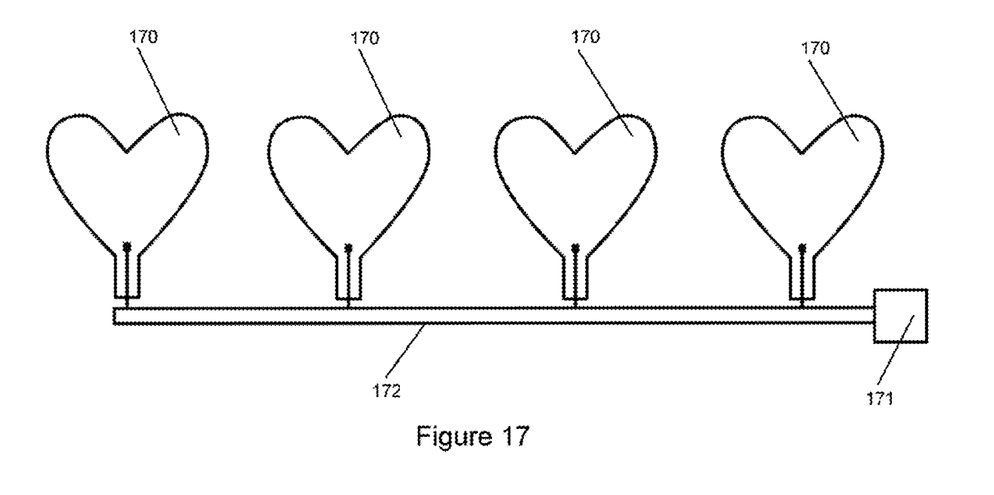
FIG. 17 is a side view of a strand of four shaped LED light bulbs.

FIG. 17 is a side view of a strand of four shaped LED light bulbs. The LED light bulbs 170 are connected to a power source 171 by means of wires 172.

What I claim is:

1. A shaped light emitting diode comprising
a raw light emitting diode and a plastic lens,
where the raw light emitting diode is surrounded by the plastic lens,
where the shape and size of the plastic lens is determined by a cavity mold that is used to create the shape of the lens, and where the color and clarity of the plastic lens is determined by a resin used to create the plastic lens,
where the raw light emitting diode emits light when connected to a power source,
where the light emitted from the raw light emitting diode travels through the plastic lens which causes a uniform and consistent light to be produced over the surface of the lens, which can be viewed from any angle, and
where the shape of the plastic lens can be any shape that can be created by a cavity mold.

2. The shaped light emitting diode of claim 1, where the surface of the plastic lens comprises one or more grooves or ridges.

3. The shaped light emitting diode of claim 1, where the surface of the plastic lens is textured.

4. The shaped light emitting diode of claim 1, where the surface of the plastic lens comprises one or more characters or designs.

5. The shaped light emitting diode of claim 1, where the plastic lens comprises bubbles or metal shavings.

6. The shaped light emitting diode of claim 1, where the plastic lens comprises shapes or designs made from steel, glass, or plastic.

7. The shaped light emitting diode of claim 1, where the plastic lens comprises electronic circuitry.

8. The shaped light emitting diode of claim 7, where the electronic circuitry causes the shaped light emitting diode to blink on and off.

9. The shaped light emitting diode of claim 1, where the plastic lens is transparent.

10. The shaped light emitting diode of claim 1, where the shaped light emitting diode is a sign.

11. The shaped light emitting diode of claim 1, where the plastic lens has a width of more than 5 mm, a height of more than 5 mm, and a depth of more than 5 mm.

12. The shaped light emitting diode of claim 1, where the plastic lens has a side that is greater than 20 mm in length.

13. The shaped light emitting diode of claim 1, where the plastic lens comprises layers of epoxy resin.

14. The shaped light emitting diode of claim 13, where the layers of epoxy resin are different colors.

15. The shaped light emitting diode of claim 1, where the plastic lens comprises a battery.

16. A shaped light emitting diode comprising
two or more raw light emitting diodes and a plastic lens,
where the raw light emitting diodes are surrounded by the plastic lens,
where the shape and size of the plastic lens is determined by a cavity mold that is used to create the shape of the lens, and where the color and clarity of the plastic lens is determined by a resin used to create the plastic lens,
where the raw light emitting diodes emit light when connected to a power source, where the light emitted from the raw light emitting diodes travel through the plastic lens which causes a uniform and consistent light to be produced over the surface of the lens, which can be viewed from any angle, and where the shape of the plastic lens can be any shape that can be created by a cavity mold.

17. The shaped light emitting diode of claim 16, where the two or more raw light emitting diodes emit different colors of light.

18. The shaped light emitting diode of claim 16, where the shaped light emitting diode is a sign.

19. The shaped light emitting diode of claim 17, where the plastic lens comprises electronic circuitry, and where the electronic circuitry causes the intensity of each raw light emitting diode to change, thereby causing the light emitted from the shaped light emitting diode to change color.

20. A device capable of producing light comprising two or more shaped light emitting diodes, where the shaped light emitting diode comprises a raw light emitting diode and a plastic lens, where the raw light emitting diode is surrounded by the plastic lens where the shape and size of the plastic lens is determined by a cavity mold that is used to create the shape of the lens, and where the color and clarity of the plastic lens is determined by a resin used to create the plastic lens, where the light emitted from the raw light emitting diode travels through the plastic lens which causes a uniform and consistent light to be produced over the surface of the lens, which can be viewed from any angle, where the shape of the plastic lens can be any shape that can be created by a cavity mold, and where the two or more shaped light emitting diodes are connected to each other by means of wires, where these wires supply power from a power source to each of the shaped light emitting diodes.

21. The device of claim 20, where the device comprises four or more shaped light emitting diodes, and where the shaped light emitting diodes are connected together both in series and in parallel to the power source.

* * * * *